US007015494B2

(12) United States Patent
Campbell

(10) Patent No.: US 7,015,494 B2
(45) Date of Patent: Mar. 21, 2006

(54) ASSEMBLIES DISPLAYING DIFFERENTIAL NEGATIVE RESISTANCE

(75) Inventor: Kristy A. Campbell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 10/193,529

(22) Filed: Jul. 10, 2002

(65) Prior Publication Data

US 2004/0007749 A1 Jan. 15, 2004

(51) Int. Cl.
H01L 47/00 (2006.01)
H01L 29/861 (2006.01)
H01L 29/88 (2006.01)

(52) U.S. Cl. .......................................... 257/4; 257/104
(58) Field of Classification Search .................... 257/4, 257/104, 40
See application file for complete search history.

(56) References Cited

U.S. PATENT DOCUMENTS

| 3,271,591 | A | 9/1966 | Ovshinsky |
| 3,622,319 | A | 11/1971 | Sharp ............................ 96/27 |
| 3,626,257 | A | 12/1971 | Esaki et al. .................... 257/15 |
| 3,743,847 | A | 7/1973 | Boland ....................... 250/510 |
| 3,961,314 | A | 6/1976 | Klose et al. |

(Continued)

FOREIGN PATENT DOCUMENTS

| JP | 56126916 A | 10/1981 |
| WO | WO 97/48032 | 12/1997 |
| WO | WO 99/28914 | 6/1999 |
| WO | WO 00/48196 | 8/2000 |
| WO | WO 02/21542 | 3/2002 |

(Continued)

OTHER PUBLICATIONS

"Three-dimensional integration of resonant tunneling structures for signal processing and three-state logic"; Robert C. Potter et al; Appl. Phys. Lett. 52(25) 220 Jun. 1988; © 1988 American Institute of Physics; pp. 2163–2164.

"Electron resonant tunneling with a high peak-to-valley ratio at room temperature in $Si_{1-x}Ge_x/Si$ triple barrier diodes"; Yoshiyuki Suda et al.; Applied Physics Letters, vol. 79, No. 14; Oct. 1, 2001; pp. 2273–2275.

"Lateral Diffusion of Silver in Vitreous Chalcogenide Films"; Journal of Non-Crystalline Solids 137 & 138 (1991); Elsevier Science Publishers B.V.; 1991; pp. 1027–1030.

"Room-Temperature Electric Field-Induced Creation of Stable Devices in $CuInSe_2$ Crystals"; David Cohen et al.; Science; vol. 258; Oct. 9, 1992; pp. 271–274.

"Physics of Semiconductor Devices"; S.M. Sze; A Wiley-Interscience Publication; John Wiley & Sons; pp. 516–537.

(Continued)

Primary Examiner—Howard Weiss
(74) Attorney, Agent, or Firm—Dickstein Shapiro Morin & Oshinsky

(57) ABSTRACT

The invention includes a device displaying differential negative resistance characterized by a current-versus-voltage profile having a peak-to-valley ratio of at least about 9. The invention also includes a semiconductor construction comprising a substrate, and a first layer over the substrate. The first layer comprises Ge and one or more of S, Te and Se. A second layer is over the first layer. The second layer comprises M and A, where M is a transition metal and A is one or more of O, S, Te and Se. A third layer is over the second layer, and comprises Ge and one or more of S, Te and Se. The first, second and third layers are together incorporated into an assembly displaying differential negative resistance. Additionally, the invention includes methodology for forming assemblies displaying differential negative resistance, such as tunnel diode assemblies.

71 Claims, 5 Drawing Sheets

U.S. PATENT DOCUMENTS

| | | | |
|---|---|---|---|
| 3,966,317 A | 6/1976 | Wacks et al. | |
| 3,983,542 A | 9/1976 | Ovshinsky | |
| 3,988,720 A | 10/1976 | Ovshinsky | |
| 4,177,474 A | 12/1979 | Ovshinsky | |
| 4,267,261 A | 5/1981 | Hallman et al. | |
| 4,269,935 A | 5/1981 | Masters et al. | 430/323 |
| 4,312,938 A | 1/1982 | Drexler et al. | 430/496 |
| 4,320,191 A | 3/1982 | Yoshikawa et al. | 430/296 |
| 4,405,710 A | 9/1983 | Balasubaamanyam et al. | 430/311 |
| 4,419,421 A | 12/1983 | Wichelhaus et al. | 429/191 |
| 4,499,557 A | 2/1985 | Holmberg et al. | 365/163 |
| 4,597,162 A | 7/1986 | Johnson et al. | |
| 4,608,296 A | 8/1986 | Keem et al. | |
| 4,637,895 A | 1/1987 | Ovshinsky et al. | |
| 4,646,266 A | 2/1987 | Ovshinsky et al. | |
| 4,664,939 A | 5/1987 | Ovshinsky | |
| 4,668,968 A | 5/1987 | Ovshinsky et al. | |
| 4,670,763 A | 6/1987 | Ovshinsky et al. | |
| 4,673,957 A | 6/1987 | Ovshinsky et al. | |
| 4,678,679 A | 7/1987 | Ovshinsky | |
| 4,696,758 A | 9/1987 | Ovshinsky et al. | |
| 4,698,234 A | 10/1987 | Ovshinsky et al. | |
| 4,710,899 A | 12/1987 | Young et al. | |
| 4,728,406 A | 3/1988 | Banerjee et al. | |
| 4,737,379 A | 4/1988 | Hudgens et al. | |
| 4,766,471 A | 8/1988 | Ovshinsky et al. | |
| 4,769,338 A | 9/1988 | Ovshinsky et al. | |
| 4,775,425 A | 10/1988 | Guha et al. | |
| 4,788,594 A | 11/1988 | Ovshinsky et al. | |
| 4,795,657 A | 1/1989 | Formigoni et al. | 427/96 |
| 4,809,044 A | 2/1989 | Pryor et al. | |
| 4,818,717 A | 4/1989 | Johnson et al. | |
| 4,843,443 A | 6/1989 | Ovshinsky et al. | |
| 4,845,533 A | 7/1989 | Pryor et al. | |
| 4,847,674 A | 7/1989 | Silwa et al. | 357/67 |
| 4,853,785 A | 8/1989 | Ovshinsky et al. | |
| 4,891,330 A | 1/1990 | Guha et al. | |
| 5,128,099 A | 7/1992 | Strand et al. | |
| 5,159,661 A | 10/1992 | Ovshinsky et al. | |
| 5,166,758 A | 11/1992 | Ovshinsky et al. | |
| 5,177,567 A | 1/1993 | Klersy et al. | 257/4 |
| 5,219,788 A | 6/1993 | Abernathey et al. | 437/187 |
| 5,238,862 A | 8/1993 | Blalock et al. | 437/52 |
| 5,296,716 A | 3/1994 | Ovshinsky et al. | |
| 5,315,131 A | 5/1994 | Kishimoto et al. | 257/57 |
| 5,335,219 A | 8/1994 | Ovshinsky et al. | |
| 5,341,328 A | 8/1994 | Ovshinsky et al. | |
| 5,350,484 A | 9/1994 | Gardner et al. | 156/628 |
| 5,359,205 A | 10/1994 | Ovshinsky | |
| 5,360,981 A | 11/1994 | Owen et al. | 257/4 |
| 5,406,509 A | 4/1995 | Ovshinsky et al. | |
| 5,414,271 A | 5/1995 | Ovshinsky et al. | |
| 5,500,532 A | 3/1996 | Kozicki et al. | |
| 5,512,328 A | 4/1996 | Yoshimura et al. | 427/498 |
| 5,512,773 A | 4/1996 | Wolf et al. | 257/471 |
| 5,534,711 A | 7/1996 | Ovshinsky et al. | |
| 5,534,712 A | 7/1996 | Ovshinsky et al. | |
| 5,536,947 A | 7/1996 | Klersy et al. | |
| 5,543,737 A | 8/1996 | Ovshinsky | |
| 5,591,501 A | 1/1997 | Ovshinsky et al. | |
| 5,596,522 A | 1/1997 | Ovshinsky et al. | |
| 5,687,112 A | 11/1997 | Ovshinsky | |
| 5,694,054 A | 12/1997 | Ovshinsky et al. | |
| 5,714,768 A | 2/1998 | Ovshinsky et al. | |
| 5,726,083 A | 3/1998 | Takaishi | 438/210 |
| 5,751,012 A | 5/1998 | Wolstenholme et al. | 257/5 |
| 5,761,115 A | 6/1998 | Kozicki et al. | 365/182 |
| 5,789,277 A | 8/1998 | Zahorik et al. | 438/95 |
| 5,825,046 A | 10/1998 | Czubatyj et al. | |
| 5,841,150 A | 11/1998 | Gonzalez et al. | 257/3 |
| 5,846,889 A | 12/1998 | Harbison et al. | 501/40 |
| 5,896,312 A | 4/1999 | Kozicki et al. | 365/153 |
| 5,912,839 A | 6/1999 | Ovshinsky et al. | |
| 5,914,893 A | 6/1999 | Kozicki et al. | 365/107 |
| 5,920,788 A | 7/1999 | Reinberg | 438/466 |
| 5,933,365 A | 8/1999 | Klersy et al. | |
| 5,998,066 A | 12/1999 | Block et al. | 430/5 |
| 6,011,757 A | 1/2000 | Ovshinsky | |
| 6,077,729 A | 6/2000 | Harshfield | 438/128 |
| 6,084,796 A | 7/2000 | Kozicki et al. | 365/153 |
| 6,087,674 A | 7/2000 | Ovshinsky et al. | |
| 6,117,720 A | 9/2000 | Harshfield | 438/238 |
| 6,141,241 A | 10/2000 | Ovshinsky et al. | |
| 6,143,604 A | 11/2000 | Chiang et al. | 438/253 |
| 6,177,338 B1 | 1/2001 | Liaw et al. | 438/629 |
| 6,236,059 B1 | 5/2001 | Wolstenholme et al. | 257/3 |
| RE37,259 E | 7/2001 | Ovshinsky | |
| 6,297,170 B1 | 10/2001 | Gabriel et al. | 438/738 |
| 6,300,684 B1 | 10/2001 | Gonzalez et al. | 257/774 |
| 6,316,784 B1 | 11/2001 | Zahorik et al. | 257/3 |
| 6,329,606 B1 | 12/2001 | Freyman et al. | 174/260 |
| 6,339,544 B1 | 1/2002 | Chiang et al. | |
| 6,348,365 B1 | 2/2002 | Moore et al. | 438/130 |
| 6,350,679 B1 | 2/2002 | McDaniel et al. | 438/634 |
| 6,376,284 B1 | 4/2002 | Gonzalez et al. | 438/129 |
| 6,388,324 B1 | 5/2002 | Kozicki et al. | |
| 6,391,688 B1 | 5/2002 | Gonzalez et al. | 438/128 |
| 6,404,665 B1 | 6/2002 | Lowrey et al. | |
| 6,414,376 B1 | 7/2002 | Thakur et al. | 257/640 |
| 6,418,049 B1 | 7/2002 | Kozicki et al. | 365/174 |
| 6,423,628 B1 | 7/2002 | Li et al. | 438/622 |
| 6,429,064 B1 | 8/2002 | Wicker | |
| 6,437,383 B1 | 8/2002 | Xu | |
| 6,462,984 B1 | 10/2002 | Xu et al. | |
| 6,469,364 B1 | 10/2002 | Kozicki | |
| 6,480,438 B1 | 11/2002 | Park | |
| 6,487,113 B1 | 11/2002 | Park et al. | |
| 6,501,111 B1 | 12/2002 | Lowery | |
| 6,507,061 B1 | 1/2003 | Hudgens et al. | |
| 6,511,862 B1 | 1/2003 | Hudgens et al. | |
| 6,511,867 B1 | 1/2003 | Lowrey et al. | |
| 6,512,241 B1 | 1/2003 | Lai | |
| 6,514,805 B1 | 2/2003 | Xu et al. | |
| 6,531,373 B1 | 3/2003 | Gill et al. | |
| 6,534,781 B1 | 3/2003 | Dennison | |
| 6,545,287 B1 | 4/2003 | Chiang | |
| 6,545,907 B1 | 4/2003 | Lowrey et al. | |
| 6,555,860 B1 | 4/2003 | Lowrey et al. | |
| 6,563,164 B1 | 5/2003 | Lowrey et al. | |
| 6,566,700 B1 | 5/2003 | Xu | |
| 6,567,293 B1 | 5/2003 | Lowrey et al. | |
| 6,569,705 B1 | 5/2003 | Chiang et al. | |
| 6,570,784 B1 | 5/2003 | Lowrey | |
| 6,576,921 B1 | 6/2003 | Lowrey | |
| 6,586,761 B1 | 7/2003 | Lowrey | |
| 6,589,714 B1 | 7/2003 | Maimon et al. | |
| 6,590,807 B1 | 7/2003 | Lowrey | |
| 6,593,176 B1 | 7/2003 | Dennison | |
| 6,597,009 B1 | 7/2003 | Wicker | |
| 6,605,527 B1 | 8/2003 | Dennison et al. | |
| 6,613,604 B1 | 9/2003 | Maimon et al. | |
| 6,621,095 B1 | 9/2003 | Chiang et al. | |
| 6,625,054 B1 | 9/2003 | Lowrey et al. | |
| 6,642,102 B1 | 11/2003 | Xu | |
| 6,646,297 B1 | 11/2003 | Dennison | |
| 6,649,928 B1 | 11/2003 | Dennison | |
| 6,667,900 B1 | 12/2003 | Lowrey et al. | |
| 6,671,710 B1 | 12/2003 | Ovshinsky et al. | |
| 6,673,648 B1 | 1/2004 | Lowrey | |
| 6,673,700 B1 | 1/2004 | Dennison et al. | |

| | | |
|---|---|---|
| 6,674,115 B1 | 1/2004 | Hudgens et al. |
| 6,687,153 B1 | 2/2004 | Lowrey |
| 6,687,427 B1 | 2/2004 | Ramalingam et al. |
| 6,690,026 B1 | 2/2004 | Peterson |
| 6,696,355 B1 | 2/2004 | Dennison |
| 6,707,712 B1 | 3/2004 | Lowery |
| 6,714,954 B1 | 3/2004 | Ovshinsky et al. |
| 2002/0000666 A1 | 1/2002 | Kozicki et al. |
| 2002/0168820 A1 | 11/2002 | Kozicki |
| 2002/0168852 A1 | 11/2002 | Harshfield et al. .......... 438/650 |
| 2003/0048744 A1 | 3/2003 | Ovshinsky et al. |
| 2003/0155589 A1 * | 8/2003 | Campbell et al. ........... 257/225 |
| 2003/0173558 A1 * | 9/2003 | Campbell .................... 257/10 |
| 2003/0212724 A1 | 11/2003 | Ovshinsky et al. |
| 2003/0212725 A1 | 11/2003 | Ovshinsky et al. |
| 2004/0035401 A1 | 2/2004 | Ramachandran et al. |

OTHER PUBLICATIONS

Axon Technologies Corporation, Technology Description: *Programmable Metalization Cell (PMC)*, pp. 1–6 (Pre–May 2000).

Das et al., *Theory of the characteristic curves of the silver chalcogenide glass inorganic photoresists*, 54 Appl. Phys. Lett., No. 18, pp. 1745–1747 (May 1989).

Helbert et al., *Intralevel hybrid resist process with submicron capability*, SPIE vol. 333 Submicron Lithography, pp. 24–29 (1982).

Hilt, DISSERTATION: *Materials characterization of Silver Chalcogenide Programmable Metalization Cells*, Arizona State Unversity, pp. Title p.–114 (UMI Company, May 1999).

Hirose et al., *High Speed Memory Behavior and Reliability of an Amorphous $As_2S_3$ Film Doped Ag*. Phys. Sat. Sol. (a) 61, pp. 87–90 (1980).

Hirose et al., *Polarity–dependent memory switching and behavior of Ag dendrite in Ag–photo–doped amorphous $As_2S_3$ films*, 47 J. Appl. Phys., No. 6, pp. 2767–2772 (Jun. 1976).

Holmquist et al., *Reaction and Diffusion in Silver–Arsenic Chalcogenide Glass Systems*, 62 J. Amer. Ceram. Soc., No. 3–4, pp. 183–188 (Mar.–Apr. 1979).

Huggett et al., *Development of silver sensitized germanium selenide photoresist by reactive sputter etching in $SF_6$*, 42 Appl. Phys. Lett., No. 7, pp. 592–594 (Apr. 1983).

Johnson et al, *Lateral Diffusion in Ag–Se Thin–Film Couples*, 40 J. Appl. Phys., No. 1, pp. 149–152 (Jan. 1969).

Kawaguchi et al., *Mechanism of photosurface deposition*, 164–166 J. Non–Cryst. Solids, pp. 1231–1234 (1993).

Kawaguchi et al., *Optical, electrical, and structural properties of amorphous Ag–Ge–S and Ag–Ge–Se films and comparison of . . .* , 79 J. Appl. Phys., No. 12, pp. 9096–9104 (Jun. 1996).

Kluge et al., *Silver photodiffusion of amorphous $Ge_xSe_{100-x}$*, 124 J. Non–Crystal. Solids, pp. 186–193 (1990).

Kolobov et al., *Photodoping of amorphous chalcogenides by metals*, 40 Advances in Physics, No. 5, pp. 625–684 (1991).

McHardy et al., *The dissolution of metals in amorphous chalcogenides and the effects of electron and ultraviolet radiation*, 20 J. Phys. C.: Solid State Phys., pp. 4055–4075 (1987).

Mitkova et al., *Dual chemical Role of Ag as an Additive in Chalcogenide Glasses*, 83 Phys. Rev. Lett., No. 19, pp. 3848–3851 (Nov. 1999).

Mitkova, *Real Time Optical Recording on Thin Films of Amorphous Semiconductors*, Insulating and Semiconducting Glasses, pp. 813–843 (P. Boolchand ed., World Scientific 2000).

Miyatani, *Electrical properties of $Ag_2Se$*, 13 J. Phys. Soc. Japan, p. 317 (1958).

Mizusaki et al., *Kinetic Studies on the Selenization of Silver*, 47 B. Chem. Soc. Japan, No. 11, pp. 2851–2855 (Nov. 1974).

Owen et al., *Metal–Chalcogenide Photoresists for High Resolution Lithography and Sub–Micron Structures*, Nanostructure Physics and Fabrication, pp. 447–451 (M. Reed ed. 1989).

Safran et al., *TEM study of $Ag_2Se$ developed by the reaction of polycrystalline silver films and selenium*, 317 Thin Solid Films, pp. 72–76 (1998).

Shimakawa et al., *Photoinduced effects and matastability in amorphous semiconductors and insulators*, 44 Advances in Physics, No. 6, pp. 475–588 (1995).

Shimizu et al., *The Photo–Erasable Memory Switching Effect of Ag Photo–Doped Chalcogenide Glasses*, 46 B. Chem Soc. Japan, No. 12, pp. 3662–3365 (1973).

Somogyi et al., *Temperature Dependence of the Carrier Mobility in $Ag_2Se$ Layers Grown on NaCl and $SiO_x$ Substrates*, 74 Acta Physica Hungarica, No. 3, pp. 245–255 (1994).

Tai et al., *Multilevel Ge–Se film based resist systems*, SPIE vol. 333 Submicron Lithography, pp. 32–39 (1982).

Tai et al., *Submicron optical lithography using an inorganic resist/polymer bilevel scheme*, 17 J. Vac. Sci. Technol., No. 5, pp. 1169–1175 (Sep./Oct. 1980).

West, Dissertation: *Electrically Erasable Non–Volatile Memory Via Electrochemical Deposition of Multifractal Aggregates*, Arizona State University, pp. Title p.–168 (UMI Co., May 1998).

West et al., *Equivalent Circuit Modeling of the $Ag|As_{0.24}S_{0.24}Ag_{0.40}|Ag$ System Prepared by Photodissolution of Ag*, 145 J. Electrochem. Soc., No. 9, pp. 2971–2974 (Sep. 1998).

Yoshikawa et al., *A new inorganic electron resist of high contrast*, 31 Appl. Phys. Lett., No. 3, pp. 161–163 (Aug. 1977).

Yoshikawa et al., *Dry development of Se–Ge inorganic photoresist*, 36 Appl. Phys. Lett., No. 1, pp. 107–117 (Jan. 1980).

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A55 (1992) 167–169.

Afifi, M.A.; Labib, H.H.; Fouad, S.S.; El–Shazly, A.A., Electrical & thermal conductivity of the amorphous semiconductor GexSe1–x, Egypt. J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 19 (1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu–As–Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M–Ag2Se–M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al–Al2O3–Ag2-xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near X=1/3 in GexSe1-x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P., Georgiev, D.G.; Goodman, B., Discovery of the Intermediate Phase in Chalcogenide Glasses, J. Optoelectronics and Advance Materials, 3 (2001), 703.

Boolchand, P.; Selvanathan, D.; Wang, Y.; Goergiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1-x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt-Quenched GeSe2 and GeS2 glasses compared, Proc. Int. Conf. Phys. Semicond. (Eds. Chadi and Harrison) $17^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Chatterjee, R.; Asokan, S.; Titus, S.S.K., Current–controlled negative–resistance behavior and memory switching in bulk As–Te–Se glasses, J. Phys. D: Appl. Phys. 27 (1994) 2624–2627.

Chen, C.H.; Tai, K.L. , Whisker growth induced by Ag photodoping in glassy GexSe1-x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.J.; Morgan, D.V., Electrical phenomena in amorphous oxide films, Rep. Prog. Phys. 33 (1970) 1129–1191.

Dejus, R.J.; Susman, S.; Volin, K.J.; Montague, D.G.; Price, D.L., Structure of Vitreous Ag–Ge–Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n–Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal photodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–x films, Thin Solid Films 376 (2000) 236–240.

Fadel, M., Switching phenomenon in evaporated Se–Ge–As thin films of amorphous chalcogenide glass, Vacuum 44 (1993) 851–855.

Fadel, M.; El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag–GeSe2 thin films, Phys. Rev. B 38 (1988) 12388–12403.

Fleury, G.; Hamou, A.; Viger, C.; Vautier, C., Conductivity and crystallization of amorphous selenium, Phys. Stat. Sol. (a) (1981) 311–316.

Fritzsche, H, Optical and electrical energy gaps in amourphous semiconductors, J. Non–Cryst. Solids 6 (1971) 49–71.

Fritzsche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P., Rouxel, T.; Keryvin, V.; Sangleboeuf, J.–C.; Serre, I.; Lucas, J., J., Indentation creep of Ge–Se chalcogenide glasses below Tg: elastic recovery and non–Newtonian flow, J. Non–Cryst. Solids 298 (2002) 260–269.

Guin, J.–P.; Rouxel, T.; Sanglebouef, J.–C; Melscoet, I.; Lucas, J., Hardness, toughness, and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As–Se–Cu glasses, J. Appl. Phys. 54 (1983) 1950–1954.

Hajto, J.; Rose, M.H.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal-l–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan. J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1–x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As–Te–Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solids 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of $Ag_x(GeSe_3)_{1-x}$ ($0<=x<=0.571$) glasses, Solid state Ionics 123 (1999) 259–269.

Kolobov, A.V., On the oringin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava, K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in $GexSe_{1-x}$ glass, Appl. Phys. Lett. 46 (1985) 543–545.

Matsushita, T.; Yamagami, T.; Okuda, M., Polarized memory effect observed on Se–SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V2O5 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni, Bi), Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge–Se glasses used in programmable metallization cell devices, J. Non–Cryst. Solids 299–302 (2002) 1023–1027.

Miyatani, S.-y., Electronic and ionic conduction in $(Ag_xCu_{1-x})_2Se$, J. Phys. Soc. Japan 34 (1973) 423–432.

Miyatani, S.-y., Ionic conduction in beta–Ag2Te and beta–Ag2Se, Journal Phys. Soc. Japan 14 (1959) 996–1002.

Mott, N.F., Conduction in glasses containing transition metal ions, J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of $GexSe_{1-x}$ amorphous thin films, Jap. J. App. Phys. 15 (1976) 849–853.

Narayanan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed–20 (1973) 195–209.

Ovshinsky S.R.; Fritzsche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E.; Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge–As–Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge–As–Te glasses, J. Phys. D: Appl. Phys. 29 (1996) 2004–2008.

Rahman, S.; Sivarama Sastry, G., Electronic switching in Ge–Bi–Se–Te glasses, Mat. Sci. and Eng. B12 (1992) 219–222.

Ramesh, K.; Asokan, S.; Sangunni K.S.; Gopal, E.S.R., Electrical Switching in germanium telluride glasses doped with Cu and Ag, Appl. Phys. A 69 (1999) 421–425.

Rose,M.J.;Hajto, J.;Lecomber, P.G.; Gage,S.M.;Choi,W.K.; Snell,A.J.;Owen,A.E., Amorphous silicon analogue memory devices, J. Non–Cryst. Solids 115 (1989) 168–170.

Rose, M.J.; Snell, A.J.; Lecomber, P.G.; Hajto, J.; Fitzgerald, A.G.; Owen, A.E., Aspects of non–volatility in a –Si:H memory devices, Mat. Res. Soc. Symp. Proc. V 258, 1992, 1075–1080.

Schuocker, D.; Rieder, G., on the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P.,. Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/ a–Si:H/metal memory devices, J. Non–Cryst. Solids 137–138 (1991) 1257–1262.

Snell, A.J.; Hajto, J.;Rose, M.J.; Osborne, L.S.; Holmes, A.; Owen, A.E.; Gibson, R.A.G., Analogue memory effects in metal/a–Si:H/metal thin film structures, Mat. Res. Soc. Symp. Proc. V 297, 1017–1021.

Steventon, A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switcing phenomenon in chalcogenide amorphous semiconductors, Solid State Comm. 8 (1970) 387–389.

Thornburg, D.D., Memory switching in a Type I amorphous chalcogenide, J. Elect. Mat. 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As–Te glasses, Phys. Rev. B 48 (1993) 14650–14652.

Tranchant, S.; Peytavin, S.; Ribes, M.; Flank, A.M.; Dexpert, H.; Lagarde, J.P., Silver chalcogenide glasses Ag–Ge–Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D.; Raghavan, K.S., Electric field induced filament formation in As–Te–Ge glass, J. Non–Cryst. Solids 2 (1970) 358–370.

Viger, C.; Lefrancois, F.; Fleury, G., Anomalous behaviour of amorphous selenium films, J. Non–Cryst. Solids 33 (1976) 267–272.

Vodenicharov, C.; Parvanov, S.; Petkov, P., Electrode–limited currents in the thin–film M–GeSe–M system, Mat. Chem. And Phys. 21 (1989) 447–454.

Wang, S.–J.; Misium, G.R.; Camp. J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

M.A. Reed et al.: "Molecular Random Access Memory Cell"; Applied Phys. Lett. vol. 78, No. 23 (Jun. 4, 2001).

J. Chen, et al.; "Room–temperature Negative Differential Resistance in Nanoscale"; Applied Phys. Lett. vol. 77, No. 8 (Aug. 21, 2002).

C. Ebner et al., "Diamagnetic Susceptibility of Superconducting Clusters: Spin–glass Behavior", Physical Review B, vol. 31, No. 1, Jun. 1, 1985.

Yoji Kawamoto, et al.; "Ionic Conduction in $As_2S_3$–$Ag_2S$, $GeS_2$–GeS–$Ag_2S$ and $P_2S_5$–$Ag_2S$ Glasses" Journal of Non–Crystalline Solids 20, 393–404 (1976).

* cited by examiner

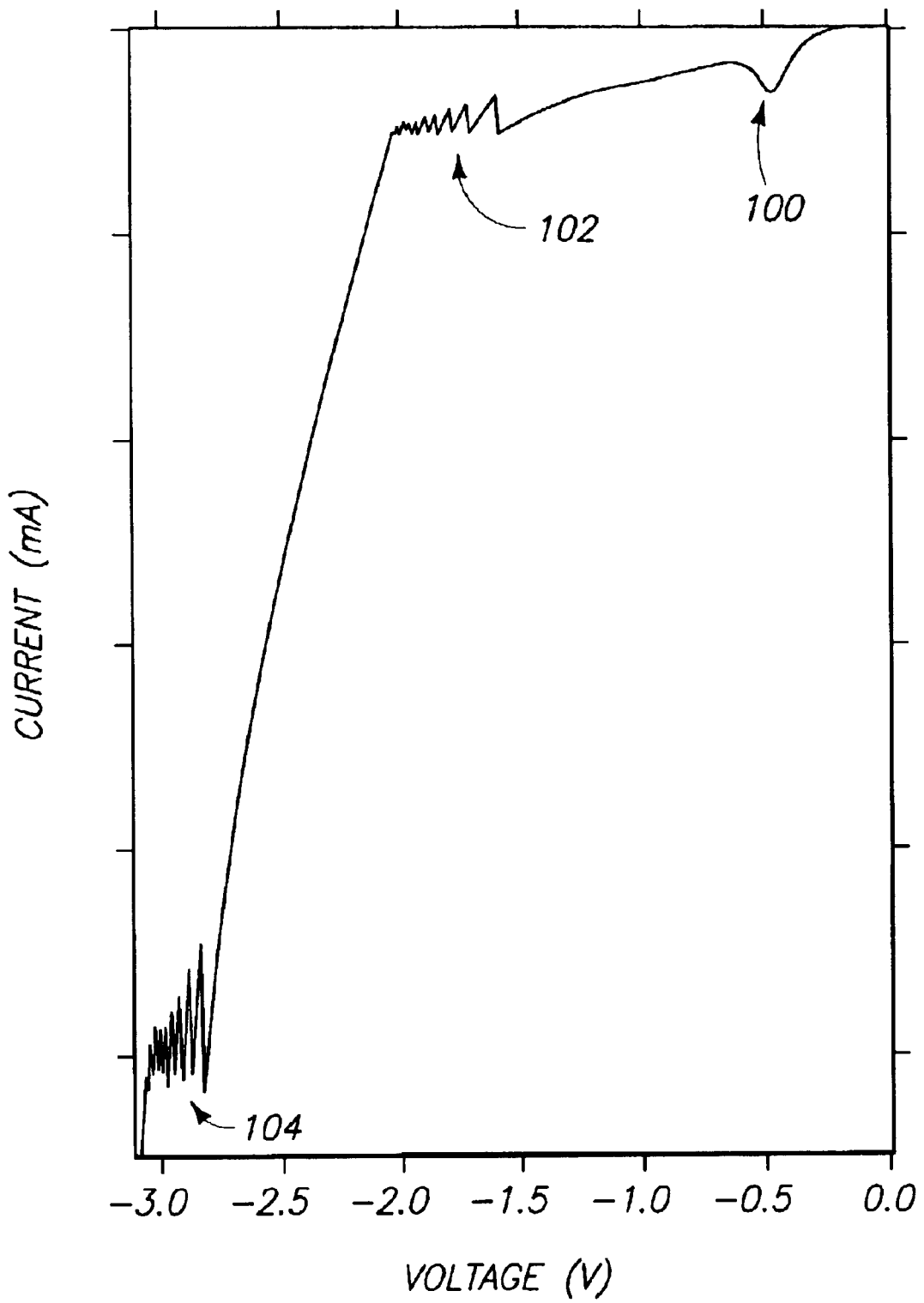

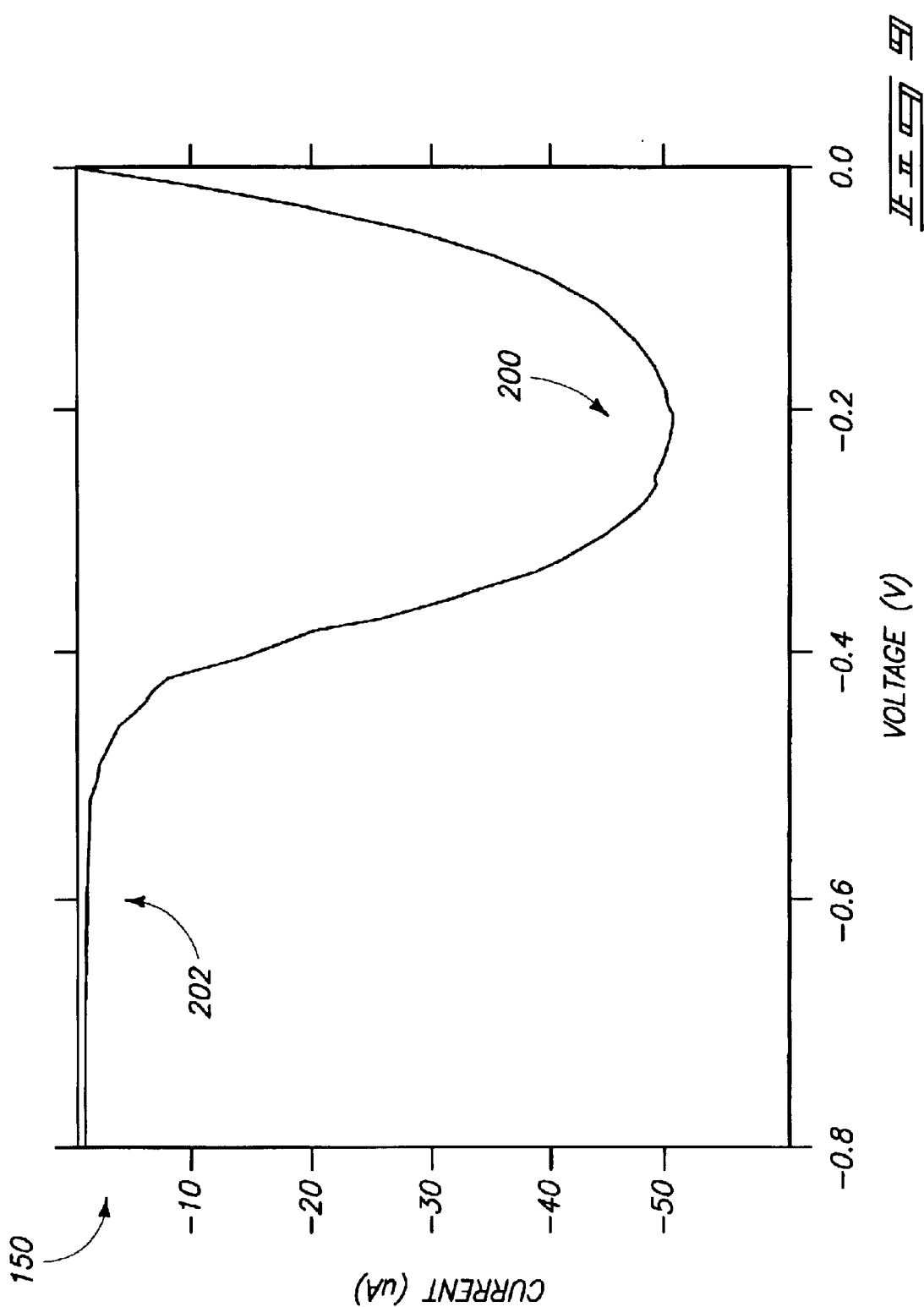

ASSEMBLIES DISPLAYING DIFFERENTIAL NEGATIVE RESISTANCE

TECHNICAL FIELD

The invention pertains to semiconductor constructions, such as, for example, assemblies displaying differential negative resistance. The invention also pertains to methods of forming assemblies displaying differential negative resistance. In particular aspects, the assemblies displaying differential negative resistance are tunnel diode assemblies.

BACKGROUND OF THE INVENTION

Assemblies displaying differential negative resistance, such as tunnel diode assemblies, can be used as components in various types of circuits, including, for example, logic circuits, and microwave oscillators. It can therefore be desired to incorporate assemblies displaying differential negative resistance into integrated circuit structures.

Various devices can be characterized in terms of the current passing through the devices relative to the amount of voltage applied to the devices. Some devices, such as, for example, tunnel diodes, will have an operating region in which an ohmic relationship of current as a function of voltage breaks down, and where a tunneling effect begins. A plot of current-versus-voltage for the devices will have a region referred to as the differential negative resistance (DNR) region, characterized by a non-ohmic relationship of current to voltage, and comprising a maximum in current value (typically referred to as a peak current value), and a minimum in current value (typically referred to as a valley current value).

The ratio of the current at the peak to the current at the valley can be utilized as a figure-of-merit for a device displaying differential negative resistance. Higher peak-to-valley ratios are considered to indicate better-quality devices. Presently, the highest peak-to-valley ratios obtained for integrated circuit tunnel diode devices are less than 8. It would be desirable to develop better devices displaying differential negative resistance which can be incorporated into integrated circuits.

It would also be desirable to develop methodology for incorporating such devices into integrated circuit constructions.

SUMMARY OF THE INVENTION

In one aspect, the invention pertains to a device displaying differential negative resistance characterized by a current-versus-voltage profile having a peak-to-valley ratio of at least about 9.

In one aspect, the invention pertains to a semiconductor construction comprising a substrate, and a first layer over the substrate. The first layer comprises Ge and one or more of S, Te and Se. A second layer is over the first layer. The second layer comprises M and A, where M is a transition metal and A is one or more of O, S, Te and Se. A third layer is over the second layer, and comprises Ge and one or more of S, Te and Se. The first, second and third layers are together incorporated into an assembly displaying differential negative resistance.

In one aspect, the invention encompasses a semiconductor construction which includes a substrate and an assembly displaying differential negative resistance supported by the substrate. The assembly comprises a material which includes Ge, a transition metal, and one or more of S, Te and Se.

The invention also encompasses methodology for forming the constructions and structures described above.

BRIEF DESCRIPTION OF THE DRAWINGS

Preferred embodiments of the invention are described below with reference to the following accompanying drawings.

FIG. 8 is a graph of current-versus-voltage for an exemplary device displaying differential negative resistance formed in accordance with an aspect of the present invention.

FIG. 9 is a graph of current-versus-voltage for the so-called first tunnel region of an exemplary device displaying differential negative resistance formed in accordance with an aspect of the present invention.

DETAILED DESCRIPTION OF THE PREFERRED EMBODIMENTS

Figure 1:
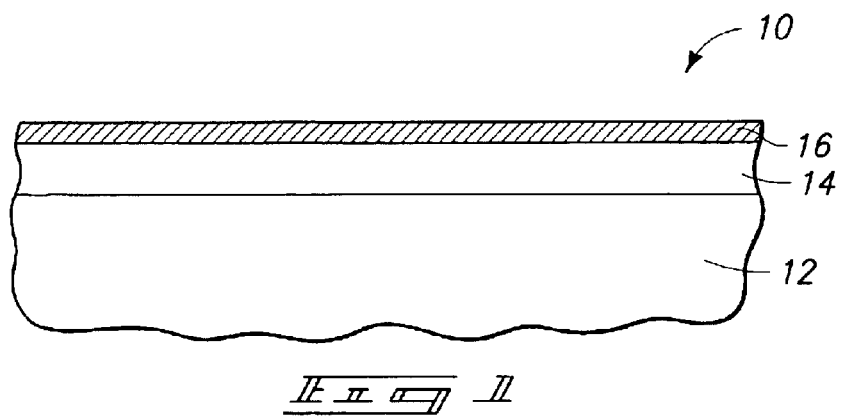
FIG. 1 is a diagrammatic, cross-sectional view of a semiconductor wafer fragment at a preliminary processing stage in accordance with an aspect of the present invention.

A first aspect of the invention is described with reference to FIGS. 1–3. Referring initially to FIG. 1, a semiconductor fragment 10 is illustrated at a preliminary processing stage. Fragment 10 comprises a substrate 12. Substrate 12 can comprise, for example, monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A layer 14 is formed over substrate 12. Layer 14 is an optional insulative material, and can comprise, for example, silicon dioxide, silicon nitride, borophosphosilicate glass (BPSG), and/or other insulative materials. Additionally, various conductive structures (not shown) can extend into or through insulative material 14. Such conductive structures can comprise part of an integrated circuit supported by semiconductor substrate 12.

A conductive material 16 is formed over insulative material 14. Conductive material 16 can comprise, for example, various metals, such as, for example, one or more of silver, tungsten, titanium and platinum. In particular aspects, conductive material 16 can comprise titanium nitride, either alone, or in conjunction with one or more metals and/or metal alloys. Accordingly, conductive 16 can comprise, consist essentially of, or consist of one or more of Ag, W, Ti, TiN and Pt. Additionally, layer 16 can comprise a conductively-doped semiconductive material. Layer 16 can be referred to as a bottom electrode in the discussion that follows.

Figure 2:
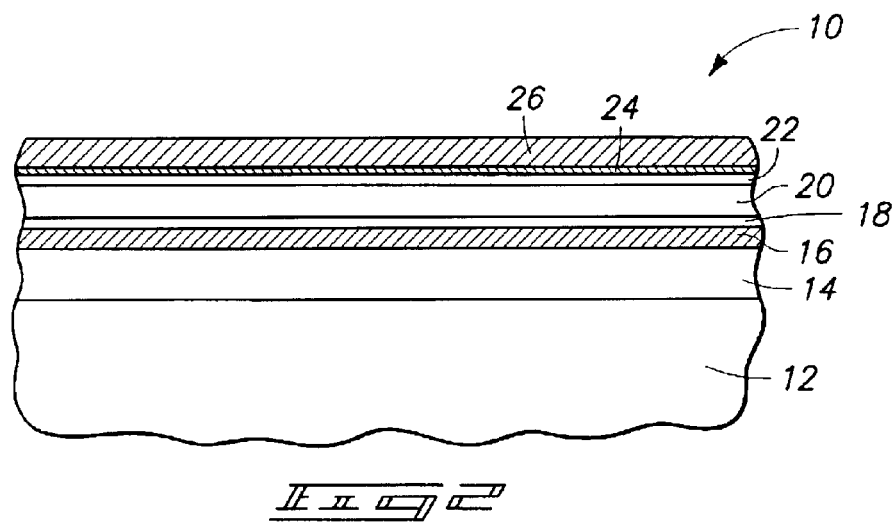
FIG. 2 is a view of the FIG. 1 fragment shown at a processing stage subsequent to that of FIG. 1.

Referring to FIG. 2, a layer 18 is formed over bottom electrode 16. Layer 18 can be referred to as a first layer of an assembly displaying differential negative resistance (such as a tunnel diode assembly), and can comprise Ge and one or more of S, Te and Se.

In particular applications, layer 18 will comprise, consist essentially of, or consist of Ge and Se. For instance, layer 18 can comprise, consist essentially of, or consist of $Ge_xSe_{(1-x)}$, such as, for example, $Ge_{0.4}Se_{0.6}$ (also referred to as $Ge_{40}Se_{60}$).

Layer 18 can be formed by, for example, either sputter deposition or evaporative deposition. If layer 18 is formed by sputter deposition, it can be formed from a target comprising both Ge and Se, and comprising the Ge and Se in a ratio which is identical to, or approximately, the desired ratio of the elements in layer 18. Accordingly, if the desired ratio of $Ge_{40}Se_{60}$ is to be formed in layer 18, the layer can be sputter-deposited from a target comprising approximately 60 parts Se for every 40 parts Ge. The target can be a mosaic target.

If layer 18 is formed by evaporative deposition, the layer can be formed by providing a source of Ge and a source of Se within a reaction chamber, and subsequently evaporating Ge and Se from the sources at appropriate rates to form the layer 18 having the desired stoichiometry of Ge and Se.

In the shown embodiment, layer 18 is physically against bottom electrode 16. It is to be understood, however, that optional intervening materials (not shown) can be provided between layers 16 and 18.

A layer 20 is formed over layer 18. Layer 20 can be referred to as a second layer of a construction displaying differential negative resistance. Layer 20 comprises M and A, where M is a transition metal and A is one or more of O, S, Te and Se. The M and A are typically present in a stoichiometry of $M_{(2+\Delta)}A$, where $\Delta$ is greater than 0. The transition metal (M) can be, for example, a metal selected from Group IB of the periodic table (also referred to as Group 11 under the so-called new notation), and accordingly can be copper or silver, for example. In particular embodiments, second layer 20 will comprise, consist essentially of, or consist of $Ag_{(2+\Delta)}A$, or $Cu_{(2+\Delta)}A$, where A is O, S, Te, and/or Se.

Layer 20 can be formed by, for example, either sputter deposition or evaporative deposition. In the shown aspect of the invention, layer 20 is physically against an upper surface of layer 18. Layer 20 can be formed by directly depositing a layer comprising $M_{(2+\Delta)}A$, or by depositing a layer which is subsequently converted to $M_{(2+\Delta)}A$. For instance, layer 20 can be formed by initially depositing a layer of $Ag_2Se$, and subsequently diffusing additional Ag into the layer from regions proximate the layer to convert the layer to $Ag_{(2+\Delta)}Se$.

A layer 22 is formed over layer 20. Layer 22 can be referred to as a third layer of an assembly displaying differential negative resistance, and can comprise the same materials described previously for first layer 18. Accordingly, layer 22 can comprise, consist essentially of, or consist of Ge and one or more of S, Te and Se. Layer 22 can be formed by, for example, either sputter deposition or evaporative deposition. In the shown aspect of the invention, layer 22 is physically against an upper surface of second layer 20.

An electrically conductive layer 24 is formed over layer 22. Layer 24 can comprise the same metal (M) as is utilized in layer 20. Alternatively, layer 24 can comprise a different metal than is utilized in layer 20. In particular applications, layer 24 will comprise, consist essentially of, or consist of one or more transition elements. In an exemplary application, layer 24 will comprise, consist essentially of, or consist of silver. Layer 24 is typically very thin, and can comprise, for example, a thickness less than 300 angstroms, and in particular applications a thickness less than 50 angstroms. Conductive material 24 is physically against an upper surface of material 22 in the shown aspect of the invention.

A conductive material 26 is formed over layer 24. Conductive material 26 can be referred to as a top electrode of an assembly displaying differential negative resistance. Conductive material 26 can comprise identical materials as described above for incorporation into conductive material 16. Accordingly, bottom electrode 16 and top electrode 26 can comprise identical compositions as one another. Alternatively, top electrode 26 can comprise a different chemical composition than does bottom electrode 16. In particular applications, top electrode 26 will comprise, consist essentially of, or consist of one or both of tungsten and silver.

In the shown application, top electrode 26 is physically against conductive material 24. If material 26 and conductive layer 24 both comprise silver, the top electrode 26 can be formed in a separate processing step from silver-containing layer 24. Further, top electrode 26 can comprise a different silver composition than does layer 24. Specifically, layer 24 can consist of very pure silver, whereas layer 26 can comprise a sliver alloy, such, for example, a copper/silver alloy. If top electrode 26 comprises silver, it can be advantageous to omit thin layer 24 from the construction 10 of FIG. 2.

In the construction 10 of FIG. 2, layers 18 and 22 can be electrically insulative, and can be referred to as glass layers. Further, layers 18 and 22 can be significantly thinner than the layer 20 provided between layers 18 and 22. For instance, layers 18 and 22 can each be thinner than layer 20 by at least about 300 angstroms. In an exemplary application, layers 18 and 20 can each have thicknesses of at least about 150 angstroms, and the layer 20 can have a thickness of at least about 450 angstroms. In a specific application, layers 18 and 22 can each have thicknesses of about 150 angstroms, and layer 20 can have a thickness of about 470 angstroms.

Figure 3:
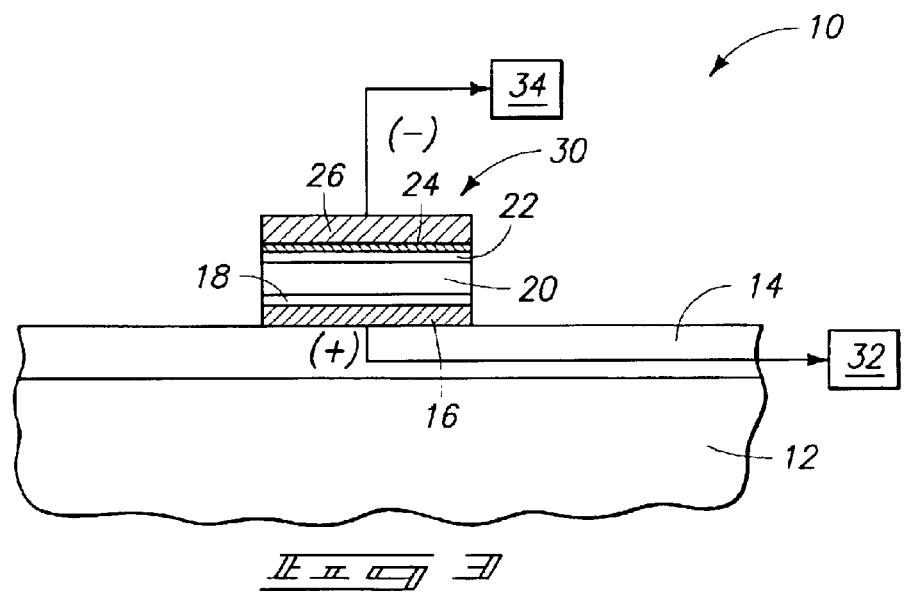
FIG. 3 is a view of the FIG. 1 fragment shown at a processing stage subsequent to that of FIG. 2.

Referring to FIG. 3, layers 16, 18, 20, 22, 24 and 26 are patterned into a construction 30. Such patterning can be accomplished by, for example, photolithographic processing utilized in conjunction with an appropriate etch, or series of etches, for extending a desired pattern through layers 16, 18, 20, 22, 24 and 26. In particular aspects, construction 30 can correspond to a tunnel diode construction.

Construction 30 is shown electrically connected with potentials 32 and 34 through top and bottom electrodes 16 and 26, respectively. Potential 32 is positive relative to potential 34, as indicated by the "+" and "−" symbols shown in FIG. 3. Potentials 32 and 34 can be utilized to drive current through construction 30, and accordingly operate construction 30 as part of an integrated circuit assembly. Construction 30 can be incorporated into the assembly as, for example, either a part of logic circuitry, or as part of a microwave oscillator construction. Potentials 32 and 34 can be generated by other circuitry (not shown) associated with substrate 12 and incorporated within an integrated circuit comprising construction 30.

Another aspect of the invention is described with reference to FIGS. 4–7. In referring to FIGS. 4–7, similar numbering will be utilized as was used above in describing the aspect of FIGS. 1–3, where appropriate.

Figure 4:
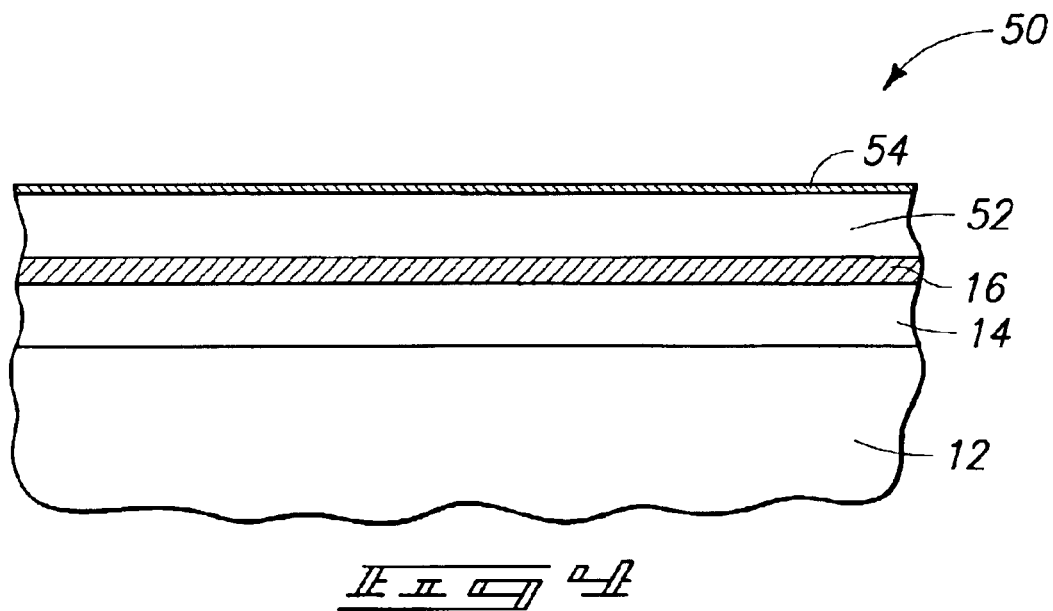
FIG. 4 is a view of a semiconductor wafer fragment shown at a processing stage subsequent to that of FIG. 1, and in accordance with a second aspect of the invention.

Referring initially to FIG. 4, a construction 50 is illustrated at a preliminary stage of the second aspect of the invention. Construction 50 comprises substrate 12, insulative material 14, and bottom electrode 16 of the FIG. 1 construction. The construction 50 can be formed in processing subsequent to that described above with reference to FIG. 1, and accordingly can correspond to a processing stage subsequent to the stage of FIG. 1.

A material 52 is formed over bottom electrode 16. In the shown embodiment, material 52 is formed physically against bottom electrode 16. Material 52 comprises Ge and one or more of S, Te and Se. Material 52 can comprise, for example, $Ge_xSe_y$, where "x" is from about 20 to about 30, and where "y" is from about 70 to about 80. The sum of x and y can be 100. Alternatively, $Ge_xSe_y$, can be expressed as comprising "x" from about 0.2 to about 0.3, "y" from about 0.7 to about 0.8, and "x"+"y" equal to 1.

In particular applications, layer 52 will comprise $Ge_{25}Se_{75}$. In the shown application, layer 52 is formed physically against bottom electrode 16.

A conductive material 54 is formed in a layer over material 52. In the shown application, layer 54 is formed physically against material 52. Layer 54 can comprise, consist essentially of, or consist of a transition metal. In particular applications, layer 54 can comprise, consist essentially of, or consist of one or more transition metals selected from Group IB of the periodic table of the elements. For instance, layer 54 can comprise, consist essentially of, or consist of copper or silver. In an exemplary application, material 52 comprises $Ge_xSe_y$, where "x" is from about 20 to about 30, and where "y" is from about 70 to about 80; and layer 54 comprises, consists essentially of, or consists of silver. Layer 54 can be formed to a thickness of, for example, about 100 Å and layer 52 can be formed to a thickness of, for example, about 500 Å.

Figure 5:
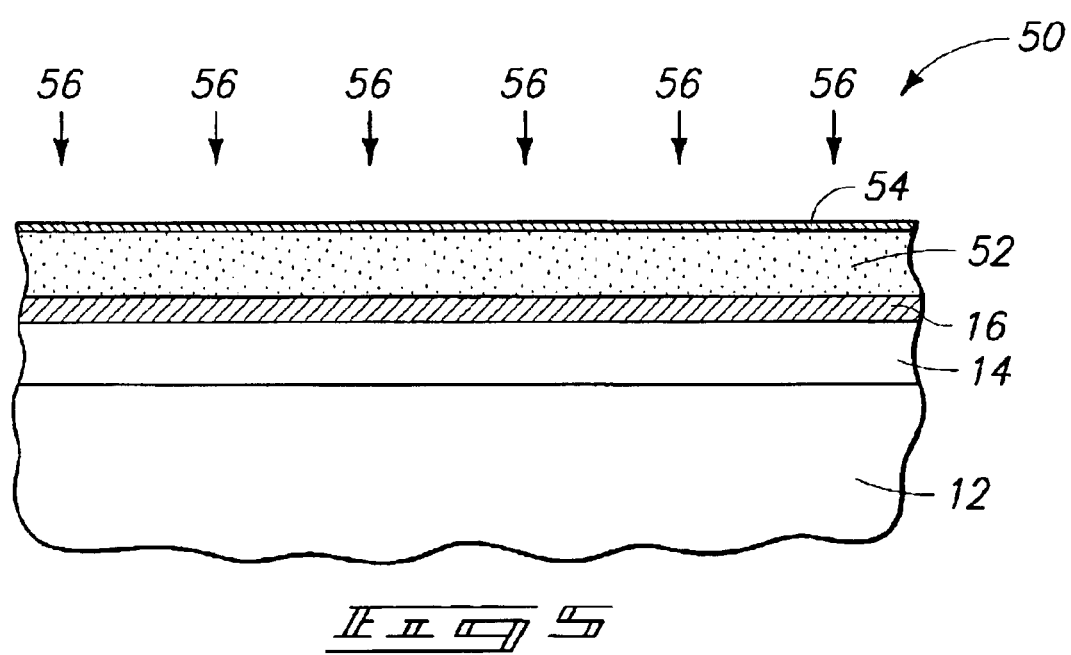
FIG. 5 is a view of the FIG. 4 fragment shown at a processing stage subsequent to that of FIG. 4.

Referring to FIG. 5, layer 54 is exposed to light 56 having an appropriate energy to cause at least some of the metal from layer 54 to disperse within material 52 (with the dispersed metal being indicated by stippling throughout material 52). Light 56 can comprise ultraviolet light. In an exemplary application a suitable wavelength of light 56 can be from about 200 nanometers to about 600 nanometers, which can disperse silver from layer 54 into material 52.

The amount of transition metal dispersed from layer 54 into material 52 is preferably equal to or greater than an amount which saturates material 52, but less than the amount which will crystallize separate phases of germanium-comprising constituents from within material 52. For instance, if material 52 comprises $Ge_{25}Se_{75}$, and layer comprises silver, the amount of silver dispersed into material 52 will preferably be sufficient to form phase-separated silver within the Ge/Se/Ag material 52 formed by dispersion of the silver into material 52. However, the amount of silver dispersed into material 52 will preferably be a low enough concentration to avoid crystallization of Ge/Se materials from within material 52. If such crystallization occurs, such can break a potential within the material and impede or destroy operation of a tunnel diode (or other device displaying differential negative resistance) comprising the material.

Material 52 and layer 54 can be formed by either sputter deposition or evaporative deposition. It is noted that even though only some of the metal of layer 54 is shown dispersed into material 52 in the shown application, the invention can encompass other applications wherein an entirety of layer 54, or substantially an entirety of the layer 54, is dispersed into material 52.

Figure 6:
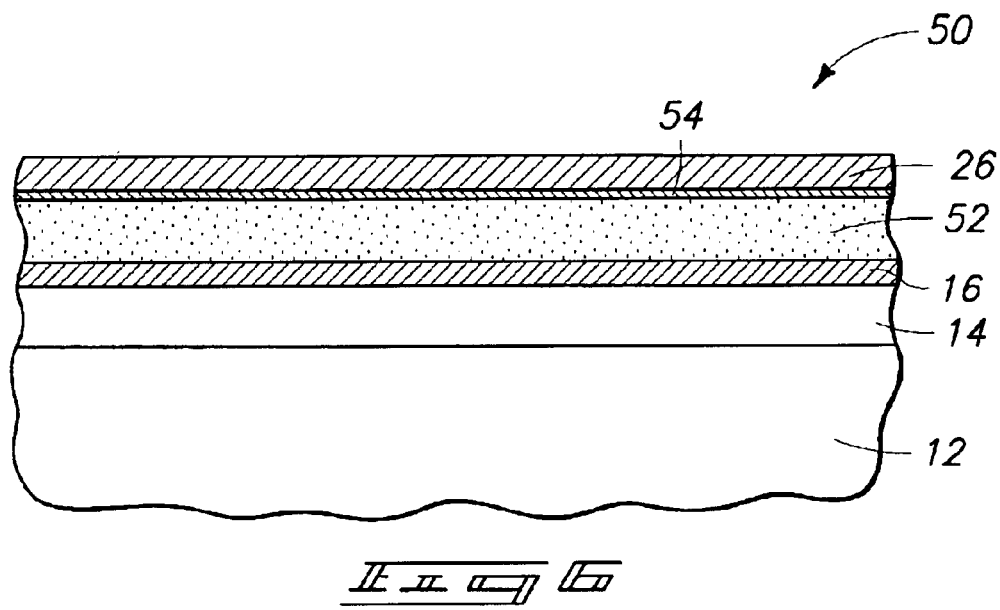
FIG. 6 is a view of the FIG. 4 fragment shown at a processing stage subsequent to that of FIG. 5.

Referring to FIG. 6, a conductive material 26 is formed over layer 54. Conductive material 26 can be referred to as a top electrode, and can comprise identical components as described with reference to FIG. 2 for the material 26 of construction 10. Accordingly, material 26 can comprise, consist essentially of, or consist of Ag, W, Ti, TiN, TaN and/or Pt; and in particular embodiments can comprise, consist essentially of, or consist of one or both of Ag and W. In the shown application, material 26 is formed physically against the layer 54.

Figure 7:
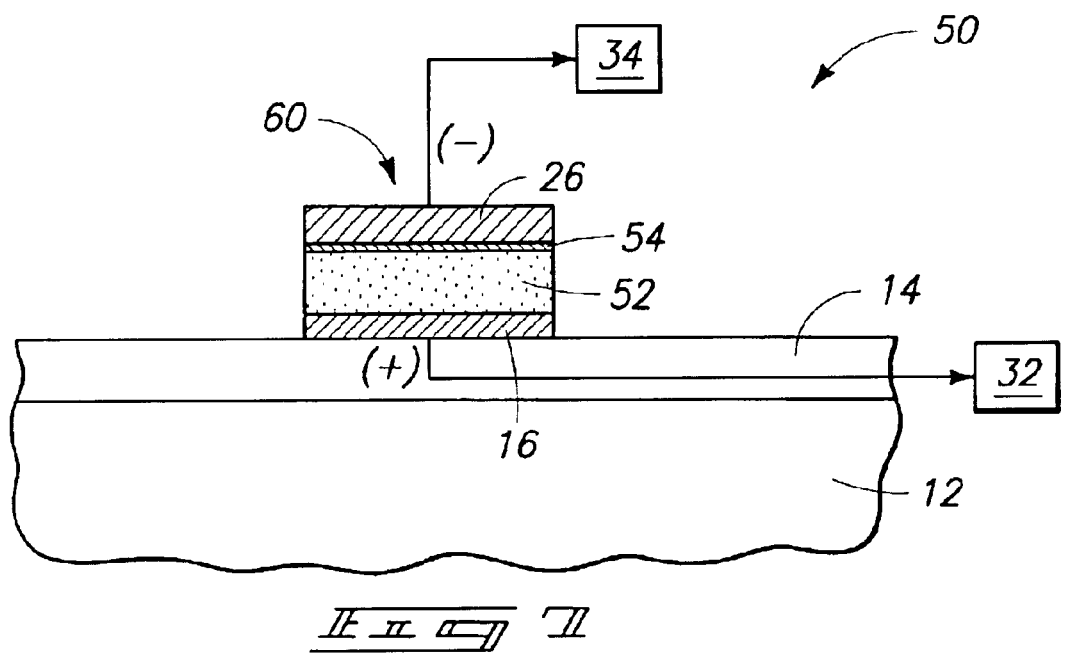
FIG. 7 is a view of the FIG. 4 fragment shown at a processing stage subsequent to that of FIG. 6.

Referring to FIG. 7, layers 16, 52, 54 and 26 are patterned into an assembly 60. Such patterning can be accomplished utilizing photolithographic processing and one or more suitable etches. The assembly 60 can correspond to a tunnel diode assembly.

The bottom electrode 16 is electrically connected with a potential 32, and the top electrode 26 is electrically connected with a potential 34. The potential 32 is positive relative to the potential 34. Potentials 32 and 34 can, as described above with reference to FIG. 3, be part of an integrated circuit structure comprising assembly 60.

The construction 60 can function comparably to the construction 30 of FIG. 3. However, it may be more difficult to specifically tailor construction 60 for a particular desired operation than to tailor construction 30. However, it can, in particular applications, be easier to accomplish the fabrication of construction 60 than that of construction 30. Accordingly, both construction 60 and construction 30 can have advantages and disadvantages relative to one another.

The devices displaying differential negative resistance formed in accordance with aspects of the present invention can have exceptional operating characteristics. Such characteristics are described with reference to FIGS. 8 and 9. FIG. 8 illustrates a graph of current (measured in microAmps) Venus voltage (measured in Volts) for a device of the type described with reference to FIG. 3, in which layers 18 and 22 comprise $Ge_{40}Se_{60}$, and in which layer 20 comprises $Ag_{(2+\Delta)}Se$, with $\Delta$ being greater than 0. The curve of FIG. 8 demonstrates that the device has a first tunnel region (or DNR) 100 at a voltage slightly above −0.5 Volts. FIG. 8 also shows that discreet quantum sets (illustrated generally by arrows 102 and 104) occur at about −2.0 Volts and at about −3.0 Volts. The discrete quantum sets indicate that the $Ag_{(2+\Delta)}Se$ of the device comprises at least about 20 quantized energy levels (the number of peaks in sets 102 and 104, and which can also include the peak 100) when the layer is exposed to voltages having an absolute value of from 0 volts to 3.5 volts. In particular aspects, the material having the quantized energy levels can be considered to comprise, consist essentially of, or consist of Ag and Se. Further, the number of quantized energy levels can be considered to be, for example, at least 4, at least 6, at least 10, at least 15 and at least 20. The quantized energy levels can, in particular aspects, be considered resonances (possibly discrete or separate relative to one another) induced when the material is exposed to appropriate voltages between 0 volts and −3.5 volts (or, more generally, to appropriate voltages having an absolute value of from greater than 0 volts to 3.5 volts).

Referring to FIG. 9, the first tunnel region of a device formed in accordance with an aspect of the present invention is shown on an expanded scale relative to the scale of FIG.

8, in a graph 150 of current-versus-voltage. In accordance with convention, the device is described as having a peak (200) at about −0.3 volts and a valley (202) at about −0.6 volts. It is noted that the peak and valley are shown inverted in the graph of FIG. 9, but convention would be to flip the graph so that the peak-to-valley ratio is greater than 1. The shown device has a peak-to-valley ratio of about −50 microAmps/−0.4 microAmps, or in other words, about 130. The shown device is an exemplary device, and various other devices displaying differential negative resistance have been formed utilizing methodology of the present invention. Such devices have been found to have peak-to-valley ratios greater than 8, and specifically to have peak-to-valley ratios of at least 9, at least about 10, at least about 20, at least about 30, at least about 40, at least about 50, at least about 75, at least about 100, and greater than at least about 100 as demonstrated by FIG. 9. It is found that the peak-to-valley ratios of devices of the present invention typically do not vary significantly with temperature, and specifically that the ratios stay relatively constant across a temperature range of from about −30° C. to about 100° C.

The device of FIG. 9 has both the peak in current value (200) and the valley in current value (202) occurring within a voltage range of from less than 0 volts to greater than −1 volt, or in other words, occurring within a voltage range having an absolute value of from greater than 0 volt to less than 1 volt.

The assemblies of the present invention can have numerous applications, including, for example, applications in logic devices, and applications in microwave oscillator devices.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed as new and desired to be protected by Letters Patent of the United States is:

1. A device displaying differential negative resistance, comprising:
   a chalcogenide glass region, said chalcogenide glass region comprising a transition metal dispersed therein, wherein said transition metal is dispersed in said chalcogenide glass region in an amount sufficient for said device to display differential negative resistance in response to an applied voltage.

2. The device of claim 1, wherein said device has the operational characteristics of a tunnel diode.

3. The device of claim 1, wherein said device is characterized by a current-versus-voltage profile having a differential negative resistance extending between a peak in current value and a valley in current value, a ratio of the current value of the peak to that of the valley being defined as a peak-to-valley ratio said peak-to-valley ratio being at least 9.

4. The device of claim 3 wherein the peak-to-valley ratio is measured at a temperature within a range of from about −30° C. to about 100° C.

5. The device of claim 3 wherein the peak in current value and valley in current value both occur within a voltage range; the voltages of the voltage range having an absolute value of from greater than 0 volt to less than 1 volt.

6. The device of claim 3 wherein the peak in current value and valley in current value both occur within a voltage range of from less than 0 volt to greater than −1 volt.

7. The device of claim 3 wherein the peak-to-valley ratio is at least about 10.

8. The device of claim 3 wherein the peak-to-valley ratio is at least about 20.

9. The device of claim 3 wherein the peak-to-valley ratio is at least about 30.

10. The device of claim 3 wherein the peak-to-valley ratio is at least about 40.

11. The device of claim 3 wherein the peak-to-valley ratio is at least about 50.

12. The device of claim 3 wherein the peak-to-valley ratio is at least about 75.

13. The device of claim 3 wherein the peak-to-valley ratio is at least about 100.

14. The device of claim 1, wherein said chalcogenide glass region comprises germanium and selenium and said transition metal is silver.

15. The device of claim 1, wherein said chalcogenide glass region comprises germanium and selenium, said device further comprising:
   a metal-chalcogenide layer over said chalcogenide glass region and comprising silver and selenium;
   a second chalcogenide glass region over said metal-chalcogenide layer and comprising germanium and selenium; and
   a silver-comprising layer over said second chalcogenide glass region.

16. The device of claim 15 wherein the chalcogenide glass regions comprise $Ge_{40}Se_{60}$.

17. The device of claim 15 wherein the chalcogenide glass regions comprise $Ge_{40}Se_{60}$ and wherein the metal-chalcogenide layer is $Ag_{(2+\Delta)}Se$, with $\Delta$ being greater than 0.

18. The device of claim 1, further comprising:
   a first electrode, wherein said chalcogenide glass region is over said first electrode and comprises germanium selenide and silver;
   a layer consisting essentially of silver over and physically against the chalcogenide glass region; and
   a second electrode over and physically against the layer consisting essentially of silver.

19. A semiconductor construction, comprising:
   a semiconductor substrate;
   a first layer over the semiconductor substrate, said first layer comprising Ge and another material selected from the group consisting of S, Te, Se, and combinations thereof, said first layer comprising an amount of a transition metal M dispersed therein to at least saturate a portion said first layer with M;
   a second layer over the first layer, the second layer comprising $M_{(2+\Delta)}A$, where A is selected from the group consisting of O, S, Te, Se, and combinations thereof, and wherein $\Delta$ is greater than zero;
   a third layer over the second layer, said third layer comprising Ge and another material selected from the group consisting of S, Te, Se, and combinations thereof; and
   the first, second, and third layers being together incorporated into an assembly displaying differential negative resistance in response to an applied voltage.

20. The construction of claim 19 wherein the transition metal is selected from Group IB of the periodic table of the elements.

21. The construction of claim 20 wherein the transition metal is copper.

22. The construction of claim 20 wherein the transition metal is silver.

23. The construction of claim 19 where A is O.

24. The construction of claim 19 where A is S.

25. The construction of claim 19 where A is Te.

26. The construction of claim 19 where A is Se.

27. The construction of claim 19 wherein the transition metal is dispersed in said first layer in an amount sufficient to form phase-separated M in said saturated portion of said first layer.

28. The construction of claim 27 wherein the transition metal is dispersed in said first layer in an amount sufficient to avoid crystallization of Ge and said another material in said saturated portion of said first layer.

29. The construction of claim 19 wherein the second layer is physically against the first layer, and wherein the third layer is physically against the second layer.

30. The construction of claim 19 wherein the second layer is physically against the first layer, wherein the third layer is physically against the second layer; and further comprising:
an electrically conductive bottom electrode under the first layer; and
an electrically conductive top electrode over the third layer.

31. The construction of claim 19 wherein the second layer is physically against the first layer, wherein the third layer is physically against the second layer and further comprising:
an electrically conductive bottom electrode under the first layer;
a silver-containing layer over the third layer; and
an electrically conductive top electrode over the silver-containing layer.

32. The construction of claim 31 wherein the silver-containing layer consists essentially of silver.

33. The construction of claim 31 wherein the first layer is physically against the bottom electrode, and wherein the third layer is physically against the silver containing layer.

34. A semiconductor construction, comprising:
a semiconductor substrate;
a first layer comprising $Ge_{40}Se_{60}$ over the semiconductor substrate, said first layer also comprising silver dispersed therein in an amount to at least saturate the $Ge_{40}Se_{60}$ with silver, form phase-separated silver within said $Ge_{40}Se_{60}$ and avoid crystallization of germanium and selenium;
a second layer comprising $Ag_{(2+\Delta)}Se$ over the first layer, where $\Delta$ is greater than 0; and
a third layer comprising $Ge_{40}Se_{60}$ over the second layer, wherein said first, second, and third layers are configured to perform as a tunnel diode.

35. The construction of claim 34 wherein the $Ag_{(2+\Delta)}Se$ layer comprises at least 4 quantized energy levels which are accessed when the $Ag_{(2+\Delta)}Se$ layer is exposed to a voltage having an absolute value of from 0 to 3.5 volts.

36. The construction of claim 34 wherein the $Ag_{(2+\Delta)}Se$ layer comprises at least 6 quantized energy levels which are accessed when the $Ag_{(2+\Delta)}Se$ layer is exposed to a voltage having an absolute value of from 0 to 3.5 volts.

37. The construction of claim 34 wherein the $Ag_{(2+\Delta)}Se$ layer comprises at least 10 quantized energy levels which are accessed when the $Ag_{(2+\Delta)}Se$ layer is exposed to a voltage having an absolute value of from 0 to 3.5 volts.

38. The construction of claim 34 wherein the $Ag_{(2+\Delta)}Se$ layer comprises at least 15 quantized energy levels which are accessed when the $Ag_{(2+\Delta)}Se$ layer is exposed to a voltage having an absolute value of from 0 to 3.5 volts.

39. The construction of claim 34 wherein the $Ag_{(2+\Delta)}Se$ layer comprises at least 20 quantized energy levels which are accessed when the $Ag_{(2+\Delta)}Se$ layer is exposed to a voltage having an absolute value of from 0 to 3.5 volts.

40. The construction of claim 34 wherein the first and third layers are each thinner than the second layer by at least about 300 Å.

41. The construction of claim 34 wherein the first and third layers have thicknesses of at least about 150 Å, and wherein the second layer has a thickness of at least about 450 Å.

42. The construction of claim 34 wherein the second layer is physically against the first layer, and wherein the third layer is physically against the second layer.

43. The construction of claim 34 wherein the second layer is physically against the first layer, wherein the third layer is physically against the second layer; and further comprising:
an electrically conductive bottom electrode under the first layer;
a silver-containing layer over the third layer; and
an electrically conductive top electrode over the silver-containing layer.

44. The construction of claim 43 wherein the silver-containing layer consists essentially of silver and is no more than 300 angstroms thick.

45. The construction of claim 43 wherein the first layer is physically against the bottom electrode, and wherein the third layer is physically against the silver-containing layer.

46. The construction of claim 43 wherein the first layer is physically against the bottom electrode; wherein the third layer is physically against the silver-containing layer; and wherein the top electrode is physically against the silver-containing layer.

47. The construction of claim 43 wherein:
the first layer is physically against the bottom electrode, the bottom electrode comprising a material selected from the group consisting of Ag, W, Ti, TiN, Pt, and combinations of the foregoing;
the third layer is physically against the silver-containing layer; and
the top electrode is physically against the silver-containing layer, the top electrode comprising at least one of Ag and W.

48. The construction of claim 47 wherein the top electrode comprises W.

49. A semiconductor construction, comprising:
a semiconductor substrate; and
an assembly displaying differential negative resistance supported by the semiconductor substrate and comprising:
a region comprising a Ge-chalcogenide glass; and
a transition metal in said Ge-chalcogenide glass in an amount at least saturating said glass and forming phase-separated said transition metal, but not causing crystallization of the components of the glass.

50. The construction of claim 49 wherein the Ge-chalcogenide glass comprises germanium selenide and said transition metal comprises silver.

51. The construction of claim 49 wherein the Ge-chalcogenide glass comprises $Ge_{40}Se_{60}$ and said transition metal consists essentially of silver.

52. The construction of claim 49 wherein the transition metal is selected from Group IB of the periodic table of the elements.

53. The construction of claim 52 wherein the transition metal is copper.

54. The construction of claim 52 wherein the transition metal is silver.

55. The construction of claim 49 wherein the Ge-chalcogenide glass comprises S.

56. The construction of claim 49 wherein the Ge-chalcogenide glass comprises Te.

57. The construction of claim 49 wherein the Ge-chalcogenide glass comprises Se.

58. The construction of claim 49 further comprising a layer consisting essentially of the transition metal over and physically against the Ge-chalcogenide glass.

59. The construction of claim 58 wherein the transition metal is selected from Group IB of the periodic table of the elements.

60. The construction of claim 59 wherein the transition metal is copper.

61. The construction of claim 59 wherein the transition metal is silver.

62. The construction of claim 58 further comprising:
   an electrically conductive bottom electrode under the Ge-chalcogenide glass; and
   an electrically conductive top electrode over the layer consisting essentially of the transition metal.

63. The construction of claim 62 wherein the Ge-chalcogenide glass is physically against the bottom electrode, and wherein the layer consisting essentially of the transition metal is physically against the top electrode.

64. A semiconductor construction, comprising:
   a semiconductor substrate;
   a first electrode over said substrate, said electrode coupled to a positive voltage source;
   a first layer of $Ge_{40}Se_{60}$ over said first electrode, said first layer of $Ge_{40}Se_{60}$ comprising Ag in an amount at least great enough to saturate said first layer, but not enough to crystallize germanium and selenium in said first layer;
   a layer of $Ag_{2+\Delta}Se$ over said first layer of $Ge_{40}Se_{60}$, wherein $\Delta$ is greater than zero;
   a second layer of $Ge_{40}Se_{60}$ over said layer of $Ag_{2+\Delta}Se$;
   a layer of Ag over said second layer of $Ge_{40}Se_\alpha$, said layer of Ag being less than 300 Å thick; and
   a second electrode over said layer of Ag, said second electrode being coupled to a negative voltage source;
   wherein each of the above layers and electrodes are configured into a structure which exhibits differential negative resistance behavior in response to an applied voltage, said differential negative resistance behavior characterized by a peak-to-valley current-versus-voltage ratio of at least 9.

65. The construction of claim 64 wherein the construction exhibits at least 4 quantized energy levels which are accessed when the construction is exposed to voltages having an absolute value of from 0 to 3.5 volts.

66. The construction of claim 64 wherein the construction exhibits at least 6 quantized energy levels which are accessed when the construction is exposed to voltages having an absolute value of from 0 to 3.5 volts.

67. The construction of claim 64 wherein the construction exhibits at least 10 quantized energy levels which are accessed when the construction is exposed to voltages having an absolute value of from 0 to 3.5 volts.

68. The construction of claim 64 wherein the construction exhibits at least 15 quantized energy levels which are accessed when the construction is exposed to voltages having an absolute value of from 0 to 3.5 volts.

69. The construction of claim 64 wherein the construction exhibits at least 20 quantized energy levels which are accessed when the construction is exposed to voltages having an absolute value of from 0 to 3.5 volts.

70. The construction of claim 64 wherein all of said layers are physically against one another.

71. The construction of claim 64 wherein the top electrode comprises W or Ag.

* * * * *

UNITED STATES PATENT AND TRADEMARK OFFICE
CERTIFICATE OF CORRECTION

PATENT NO. : 7,015,494 B2
APPLICATION NO. : 10/193529
DATED : March 21, 2006
INVENTOR(S) : Kristy A. Campbell It is certified that error appears in the above-identified patent and that said Letters Patent is hereby corrected as shown below:

In the Specification, the following errors are corrected:

Column 5, line 55, "layer" should read --layer 54--; and

Column 6, line 41, "Venus" should read --versus--.

In the Claims, the following error is corrected:

Claim 64, column 12, line 4, "$Ge_{40}Se_\alpha$" should read --$Ge_{40}Se_{60}$--.

On the title page (56) In the Other Publications portion of References Cited, the following errors are corrected:

""Room-Temperature Electric Field-Induced Creation of Stable Devices in $CuInSe_2$ Crystals"; David Cohen et al.; Science; vol. 258; Oct. 9, 1992; pp. 271-274."

Should read

--"Room-Temperature Electric Field-Induced Creation of Stable Devices in $CuInSe_2$ Crystals"; David Cahen et al.; Science; vol. 258; Oct. 9, 1992; pp. 271-274.--;

"Hirose et al., *High Speed Memory Behavior and Reliability of an Amorphous $As_2S_3$ Film Doped Ag.* Phys. Sat. Sol. (a) 61, pp. 87-90 (1980)."

Should read

--Hirose et al., *High Speed Memory Behavior and Reliability of an Amorphous $As_2S_3$ Film Doped Ag*, Phys. Stat. Sol. (a) 61, pp. 87-90 (1980).--;

UNITED STATES PATENT AND TRADEMARK OFFICE
CERTIFICATE OF CORRECTION

PATENT NO. : 7,015,494 B2
APPLICATION NO. : 10/193529
DATED : March 21, 2006
INVENTOR(S) : Kristy A. Campbell It is certified that error appears in the above-identified patent and that said Letters Patent is hereby corrected as shown below:

In the title page (56) References cited, the following errors are corrected:

"Boolchand, P.; Selvanathan, D.; Wang, Y.; Goergiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132."

Should read

--Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97-132.--;

"Guin, J.-P.; Rouxel, T.; Keryvin, V.; Sangleboeuf, J.-C.; Serre, I.; Lucas, J., J., Indentation creep of Ge-Se chalcogenide glasses below Tg: elastic recovery and non-Newtonian flow, J. Non-Cryst. Solids 298 (2002) 260-269."

Should read

--Guin, J.-P.; Rouxel, T.; Keryvin, V.; Sangleboeuf, J.-C.; Serre, I.; Lucas, J., Indentation creep of Ge-Se chalcogenide glasses below Tg: elastic recovery and non-Newtonian flow, J. Non-Cryst. Solids 298 (2002) 260-269.--;

Kotkata, M.F.; Afif, M.A,; Labib, H.H.; Hegab, N.A.; Abdel-Aziz, M.M., Memory switching in amorphous GeSeT1 chalcogenide semiconductor films, Thin Solid Films 240 (1994) 143-146."

Should read

--Kotkata, M.F.; Afifi, M.A,; Labib, H.H.; Hegab, N.A.; Abdel-Aziz, M.M., Memory switching in amorphous GeSeTi chalcogenide semiconductor films, Thin Solid Films 240 (1994) 143-146.--; and

UNITED STATES PATENT AND TRADEMARK OFFICE
CERTIFICATE OF CORRECTION

PATENT NO. : 7,015,494 B2
APPLICATION NO. : 10/193529
DATED : March 21, 2006
INVENTOR(S) : Kristy A. Campbell It is certified that error appears in the above-identified patent and that said Letters Patent is hereby corrected as shown below:

In the title page (56) References Cited, the following errors are corrected:

"Tranchant, S.; Peytavin, S.; Ribes, M.; Flank, A.M.; Dexpert, H.; Largarde, J.P., Silver chalcogenide glasses Ag-Se-Ge: Ionic conduction and exafs structural investigation, Transport-structure relations in fast ion and mixed conductors Proceedings of the 6th Riso International symposium. Sep. 9-13, 1985."

Should read

--Tranchant, S.; Peytavin, S.; Ribes, M.; Flank, A.M.; Dexpert, H.; Largarde, J.P., Silver chalcogenide glasses Ag-Se-Ge: Ionic conduction and EXAFS structural investigation, Transport-structure relations in fast ion and mixed conductors, Proceedings of the 6th RISO International symposium, Sep. 9-13, 1985.--.

Signed and Sealed this

Twenty-sixth Day of September, 2006

JON W. DUDAS
*Director of the United States Patent and Trademark Office*